United States Patent
Luryi

(10) Patent No.: US 8,084,838 B2
(45) Date of Patent: Dec. 27, 2011

(54) LARGE-AREA PIN DIODE WITH REDUCED CAPACITANCE

(75) Inventor: Serge Luryi, Old Field, NY (US)

(73) Assignee: Research Foundation of State University of New York, Albany, NY (US)

( * ) Notice: Subject to any disclaimer, the term of this patent is extended or adjusted under 35 U.S.C. 154(b) by 296 days.

(21) Appl. No.: 12/383,665

(22) Filed: Mar. 26, 2009

(65) Prior Publication Data

US 2009/0242932 A1 Oct. 1, 2009

Related U.S. Application Data

(60) Provisional application No. 61/072,229, filed on Mar. 28, 2008.

(51) Int. Cl.
*H01L 31/075* (2006.01)

(52) U.S. Cl. .......... 257/464; 257/656; 257/E31.092

(58) Field of Classification Search .......... 257/459, 257/461, 464, 656, E31.092
See application file for complete search history.

(56) References Cited

U.S. PATENT DOCUMENTS

| | | | | |
|---|---|---|---|---|
| 5,594,237 | A * | 1/1997 | Kulick et al. | 250/214.1 |
| 6,548,878 | B1 * | 4/2003 | Nauleau et al. | 257/431 |
| 6,753,214 | B1 * | 6/2004 | Brinkmann et al. | 438/184 |
| 7,265,354 | B2 | 9/2007 | Kastalsky et al. | |
| 2004/0013367 | A1 * | 1/2004 | Herbert et al. | 385/39 |

OTHER PUBLICATIONS

Ruhle et al. "A (Ga, Al)As Semiconductor Scintillator with Monolithically Integrated Photodiode: A New Detector." IEEE Transactions on Nuclear Science, vol. NS-30, No. 1, Feb. 1983. pp. 436-439.*

U.S. Appl. No. 11/703,805, filed Feb. 8, 2007, Katalsky, et al.
A. Kastalsky, S. Luryi, and B. Spivak, "Semiconductor high-energy radiation scintillation detector," *Nucl. Instr. and Meth. in Phys. Research A* 565, pp. 650-656(2006).
E. BurStein, "Anomalous Optical Absorption Limit in InSb", *Phys. Rev.* 93, pp. 632-633 (1954).
K. Seeger, *Semiconductor Physics: An Introduction*, 9th edition, Springer (2004).
G. Kirchhoff, "Zur Theorie des Kondensators,"*Monatsb. Deutsch Akad. Wiss*, Berlin, 1877, pp. 144-162.
4. Susann J.N. Shaw, "Circular-Disk Viscometer and Related Electrostatic Problems," *Phys. Fluids* 13, pp. 1935-1947(1970).
G.J. Sloggett, N.G. Barton and S.J. Spencer, "Fringing fields in disc capacitors," *J. Phys.* A. 19, pp. 2725-2736 (1986).
T.V. Rao, "Capacity of the circular plate condenser: analystical solutions for large gaps between the plates," *J. Phys. A.* 38, pp. 10037-10056 (2005).
W.C. Chew and J.A. Kong, "Microstrip Capacitance for a Circular Disk Through Matched Asymptotic Expansions," *SIAM Journal on Applied Mathematics* 42, pp. 302-317 (1982).
H.A. Wheeler, "A Simple Formula for the Capacitance of a disc on Dielectric on a Plane," *IEEE Transactions on Microwave Theory and Techniques* 30, pp. 2050-2054 (1982).

(Continued)

*Primary Examiner* — Benjamin Sandvik
*Assistant Examiner* — Wensing Kuo
(74) *Attorney, Agent, or Firm* — Lawrence G. Fridman

(57) ABSTRACT

The invention provides a design of PIN diode having a low capacitance and a large area of effective collection of photogenerated charge. The low capacitance is obtained by replacing a continuous collector layer in the diode by a sparse array of collector disks interconnected by narrow metallic runners at a different structural level separated from the collector discs by an interlevel dielectric.

16 Claims, 6 Drawing Sheets

OTHER PUBLICATIONS

R.E. Nahory, M.A. Pollack, W.D. Johnston, R.L. Barns, "Bandgap versus composition and demonstration of Vegard's law for InGaAsP lattice-matched to InP", *Appl. Phys. Lett.* 33, pp. 659-661 (1978).

M. Gallant, N. Puetz, A. Zemel, and F.R. Shepard, "Metalorganic chemical vapor deposition InGaAs pin photodiodes with extremely low dark current", *Appl. Phys. Lett.* 52, pp. 733-735 (1988).

Y. Liu, S.R. Forrest, V.S. Ban, K.M. Woodruff, J. Colosi, G.C. Erikson, M.J. Lamge, and G.H. Olsen, "Simple, very low dark current, planar long-wavelength avalanche photodiode", *Appl. Phys. Lett* 53, pp. 1311-1313 (1988).

E.F. Kuester, "Explicit Approximations . . ." *Jrnl of Electromagnetic Waves and Applications*, vol. 2, No. 1, 103-135, 1997.

* cited by examiner

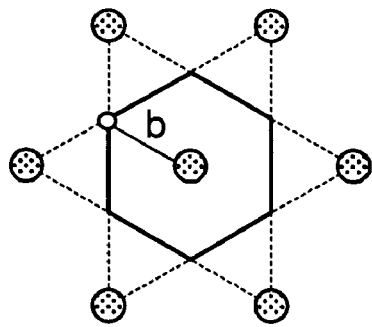
F I G. 5
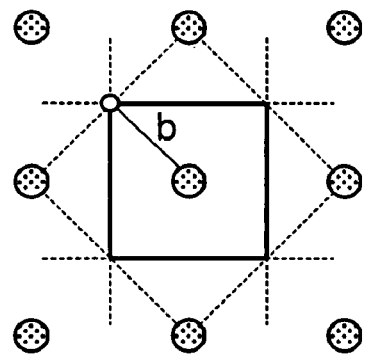
F I G. 6
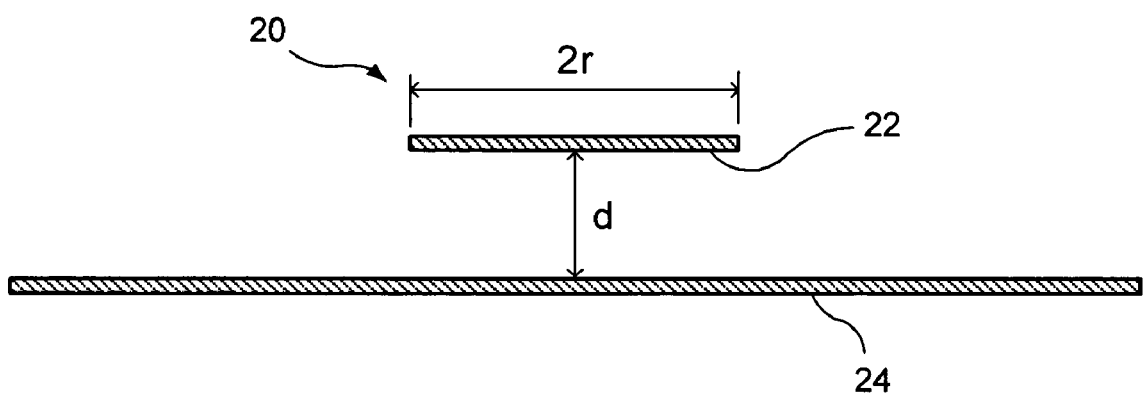
F I G. 7
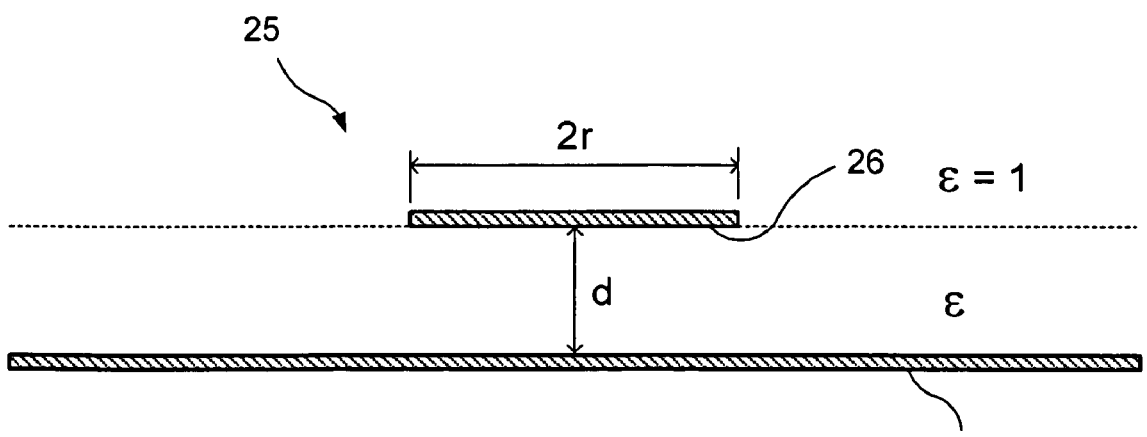
F I G. 8

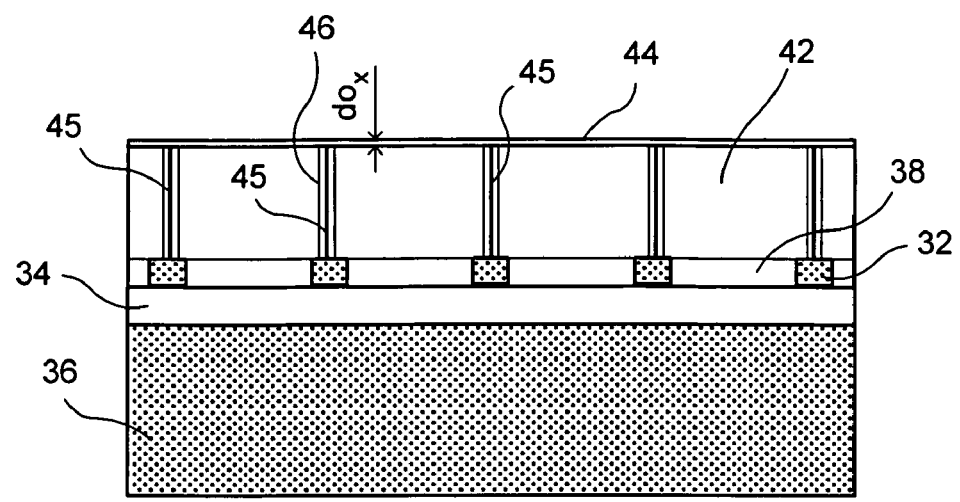
F I G. 9
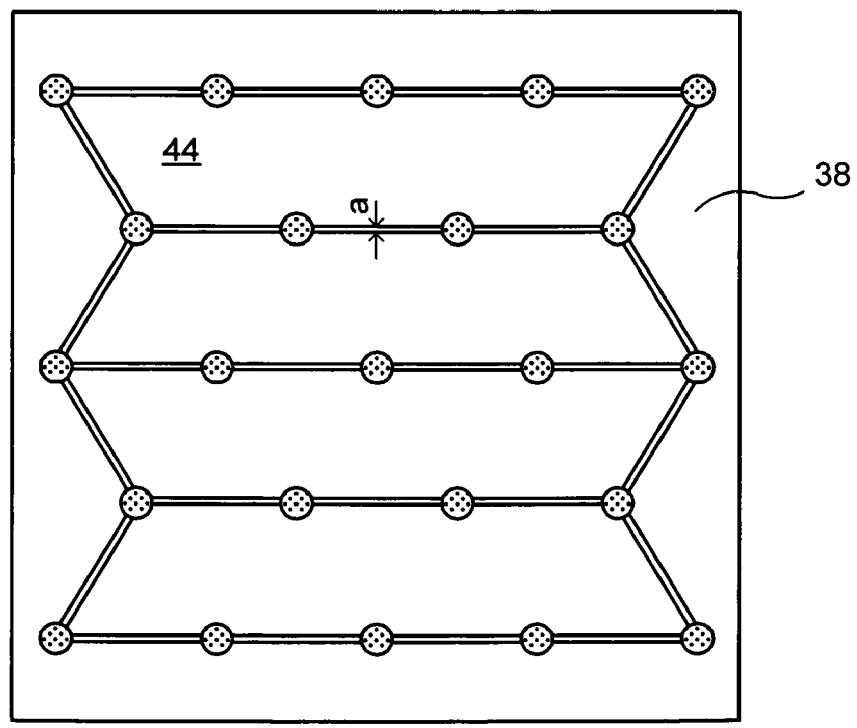
F I G. 10

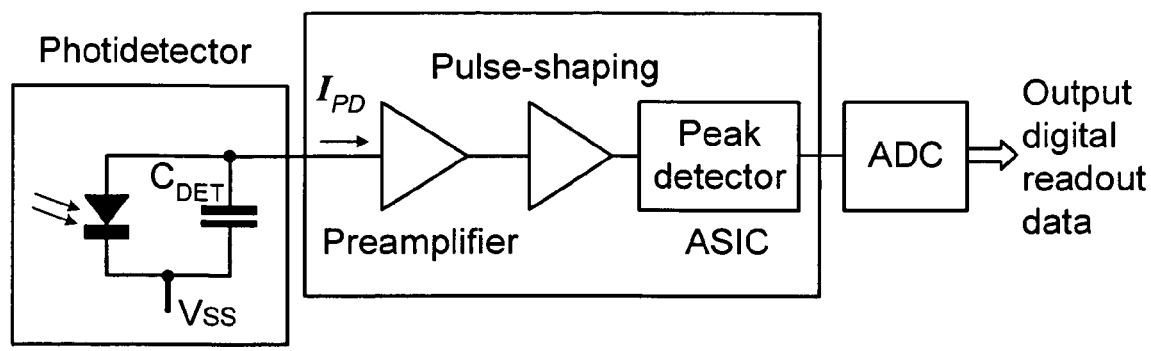
F I G. 11
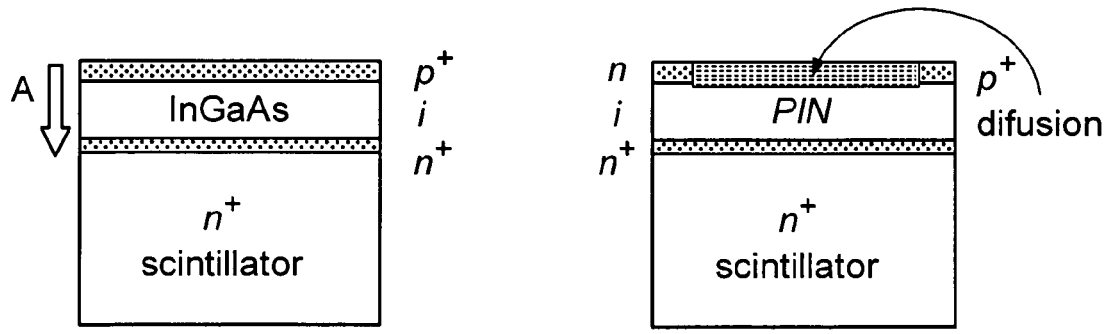
F I G. 12        F I G. 13

LARGE-AREA PIN DIODE WITH REDUCED CAPACITANCE

THIS NON-PROVISIONAL APPLICATION CLAIMS PRIORITY UNDER 35 USC 119 (e) OF U.S. PROVISIONAL APPLICATION SER. NO. 61/072,229 FILED BY DR. SERGE LURYI ON MAR. 28, 2008.

FIELD OF THE INVENTION

The present invention relates in general to high-energy radiation detectors, and in particular it relates to radiation detectors based on direct-gap semiconductor scintillator wafers, endowed with an epitaxial photodiode on a surface thereof.

BACKGROUND OF THE INVENTION

Referring now to FIGS. 1 and 2 illustrating the prior-art two dimensional (2D) pixel architectures. FIG. 1, shows the cleaved pixel design with device area being about 1 mm×1 mm. The key motivation for this design is as follows. Spatial independence of the scintillation flux on the pixel photodiodes should be ensured, so that the readout would be the same irrespective of where the interaction occurs in the volume of pixel. Due to the high refractive index of InP, only a small fraction of radiation impinging on the side surface from a random point will escape, while most of the radiation will be internally reflected and eventually reach the absorbing photodiode. If the pixels were not cleaved and instead a planar array as grown was used, this will be resulted in the following situation. The signal would be shared between neighboring pixels in the amount that depends on the position of the interaction. The main disadvantage of this prior art design, is the large area of the photodiode (1 mm$^2$) which translates into a large diode capacitance (about 50 pF) that places stringent demands on the electronic amplifiers in the flip-chip readout Si circuitry.

Referring now to FIG. 2 illustrating a prior art integrated pixel architecture. In this design, diodes form an array of squares or hexagons. The explosion symbol reflects the position of an interaction event, assumed to be a distance h deep into the scintillator body. FIG. 2 illustrates the alternative prior-art design which addresses the issue of low capacitance. The idea is to make an array of photo-diodes of much smaller area, without cleaving. The full power of planar integrated technology is then deployed. For example, if 100 μm×100 μm diodes are used, instead of the current 1 mm×1 mm, the capacitance goes down by two orders of magnitude. However, the number of photons collected by a single pixel decreases, albeit by a smaller amount. The reason that the number of photons decreases is because photons generated by a single ionization event (a Compton or photoelectric interaction in the given slab) are now shared by several 2D pixels. The total area of illuminated pixels is of the order h$^2$, where h is the distance from the interaction region to the top surface of the detector, i.e. the surface where the epitaxial photodiodes are located. Inasmuch as h$^2$<<1 mm$^2$, the amount of photons received by a single 100 μm×100 μm pixel decreases by the smaller amount, compared to the 100-fold decrease in the area. The integrated pixel design thus enhances the charge per capacitance ratio. This implies a higher voltage developed in a single diode in response to receiving the scintillating radiation and therefore the higher signal to noise ratio. This prior art design provides the capability of assessing the deposited energy by the analysis of the ratio of signals received by the central diode (the one closest to the location of an ionization event) and its nearest neighbors.

To better understand the collection of photons in the integrated-pixel architecture, it has been noted that the propagation of scintillating radiation in the body of n-doped InP scintillator is diffusive, as shown by the research in room temperature experiments. Most of the scintillation photons reaching the detectors surface are not photons directly generated by the electrons and holes at the site of the gamma particle interaction, but photons that have been re-absorbed and re-emitted a multiple number of times. The motion of light form the initial interaction site to the detector is a random and characterized by a mean free path of about λ=100 μm (in the samples of doping n=6·10$^{18}$ cm$^{-3}$ at room temperature). The corresponding diffusion coefficient of light can be estimated as D=λ$^2$/τ≈10$^5$ cm$^2$/s, where τ=(Bn)$^{-1}$≈1 ns is the radiative recombination time and B≈1.2×10$^{-10}$ cm$^3$/s is the radiative recombination constant in InP. This estimate justifiably assumes that light propagation between the absorption/re-emission sites is practically instantaneous.

To estimate the illumination area by an interaction event that occurs a distance h deep into the scintillator, the diffusion equation has been solved for the density of photons N($\vec{r}$,t):

$$D\nabla^2 N(\vec{r}, t) = \frac{\partial N}{\partial t} \quad (1)$$

with the boundary condition, N(z=0,t)=0, of absorbing detector surface and the initial condition N($\vec{r}$,t=0)=N$_0$δ($\vec{r}$ - $\vec{r}_0$), where $\vec{r}_0$=(0,0,-h). Using the known Green's function of the diffusion equation (1), it was found the resultant flux density j($\vec{r}$,t) [cm$^{-2}$ s$^{-1}$] through the detector surface (the boundary plane) in the form of $$j(r, t) \equiv -D\frac{\partial N}{\partial z} = \frac{N_0 h}{t(4\pi Dt)^{3/2}} \exp\left(-\frac{r^2 + h^2}{4Dt}\right) \quad (2)$$

It has been observed that the flux density decays radially from the epicenter as a Gaussian function of width d=$\sqrt{Dt}$. For the total pulse duration T=h$^2$/2D=ν·τ, where ν is the average number of the absorption/re-emission events, we have d=$\sqrt{2DT}$=h≈λ$\sqrt{T/\tau}$=λ$\sqrt{\nu}$. In the experiments at room temperature, h≈300 μm and ν≈10, so that the Gaussian width of the flux distribution is about 3λ≈h. Both estimates, d=h and d=λ$\sqrt{\nu}$ give roughly the same width.

In the above-discussed prior art, all embodiments of the scintillator, the capacitance of the epitaxial PIN diode has been determined by the volume of its charge collection, and therefore it scales with the area of the pixel. Thus, there has been a need for a new architecture that provides a substantially smaller capacitance for same collection volume, the architecture which provides substantially higher pixel sensitivity.

SUMMARY OF THE INVENTION

One aspect of the invention relates to the composition of the scintillator body which addresses an essential issue of how to make the semiconductor transparent at wavelengths of its own fundamental interband emission. This emission wavelengths constitutes the scintillation spectrum of the radiation detector. For one of the embodiments of InP, the scintillation spectrum is within a relatively narrow band near 920 nm. The semiconductor is made relatively transparent to this radiation by doping it heavily with donor impurities, so as to introduce the so-called Burstein (or Moss-Burstein) shift between the emission and the absorption spectra. For the purposes of the invention, the term "heavy doping" means "degenerately doped with shallow donors" and specifies the doping as being so heavy that the Fermi energy counted from the bottom of semiconductor conduction band is larger than the operating temperature of the detector expressed in energy units. Because of the heavy doping, the edge of absorption is blue-shifted relative to the emission edge by the carrier Fermi energy. This quantum effect is called the Burstein shift. It underlies operation of many prior art semiconductor lasers. The transparency of semiconductor body to its own radiation helps delivering the scintillating photons, generated by high energy radiation deep inside the semiconductor wafer, to the surface of the wafer.

Another aspect of the invention concerns how to ensure the collection of the scintillating photons in photodetector. External detectors are inefficient for the following reason. Owing to the high refractive index of semiconductors, e.g., n=3.3 for InP, most of the scintillating photons will not escape from the semiconductor, but suffer a complete internal reflection. Only those photons that are incident on the InP-air interface within a narrow cone $\sin \theta < 1/n$ off the perpendicular to the interface, have a chance to escape from the semiconductor. The escape cone accommodates only about 2% of isotropic scintillation, signifying the inefficiency of collection. It is essential to provide the scintillator wafer with an epitaxial photodetector that has a substantially similar or even higher refractive index. Such epitaxial photodetector is most conveniently implemented as PIN photodiode. In principle one can use a single photodiode over the entire area of the chip, but for a chip of large area this may introduce a large capacitance that is difficult to handle by a readout circuitry. Even for a chip having an area of 1 mm×1 mm (1 mm$^2$), the typical capacitance of a PIN diode would be about 50 pF. Such a high value of diode capacitance presents stringent and hard-to-meet requirements to the readout circuitry. Separation of 1,000 electron-hole pairs on such a capacitor produces a voltage of about 3.2 µV, which is difficult to measure due to noise. This limits the sensitivity of the 1 mm$^2$ photodetector PIN diode. To achieve higher sensitivity it is possible to use smaller-area independently contacted diodes forming a two-dimensional (2D) array of pixels. Each of the small-area diodes has a proportionally smaller capacitance, which is beneficial from the standpoint of noise, but it also receives a smaller share of the scintillation flux generated deep inside the scintillator.

As to still another aspect of the invention, it would be highly desirable to implement a PIN diode that collects light from the same area but has a substantially lower capacitance, so that the sensitivity threshold would be much lower.

A still further aspect of the invention relates to the three dimensional (3D) pixellation of the scintillator response. A stack of individually contacted two dimensional (2D) pixellated semiconductor slabs forms a 3D array of radiation detectors. A gamma photon incident on such an array, undergoes several Compton interactions depositing varying amounts of energy $L_i$ in pixels with coordinates $(x_i, y_i, z_i)$, where $z_i$ describes the position in the stack of the slab with a responding ("firing") pixel and $(x_i, y_i)$ are 2D coordinates of the firing pixel in that slab. Thus, each incident photon produces a cluster of firing pixels that reports their positions and the amount of energy deposited. The information reported enables one to estimate both the incident photon energy and the direction to the source.

A reasonable figure of merit (FoM) for the pixel performance is the ratio of expected number of photons incident of the pixel's PIN diode in response to the typical Compton interaction that occurred within the volume of said pixel, to the capacitance of the pixel's diode. In the prior art design, at least for small enough pixels, both parameters in the FoM scale with the diode area and hence their ratio remains approximately constant. Thus, it is an essential aspect of the present invention to improve said FoM and thus to enhance the signal to noise ratio. This is accomplished by substantially lowering the capacitance of the pixel's PIN diode, while keeping the same volume of absorption (the depleted region of the PIN structure) and therefore keep in the same typical number of absorbed scintillation photons.

BRIEF DESCRIPTION OF THE DRAWINGS

FIG. 5 is a schematic diagram illustrating a honeycomb (hexagonal) arrangements of the collection contacts;

FIG. 6 is a schematic diagram illustrating a square lattice arrangement of the collection contacts;

FIG. 7 is a schematic diagram illustrating a parallel plate capacitor formed by a circular disc;

FIG. 8 is a schematic diagram illustrating parallel plate capacitor formed by a circular disc separated from an infinite plan with a dielectric layer of a relative permittivity inserted between the plane and the disc;

FIG. 9 is a schematic diagram of a cross-sectional view showing connections in a single pixel;

FIG. 10 is a top plan view illustrating the connections in a single pixel of FIG. 9;

FIG. 11 is a schematic block diagram of the readout ASIC design of an individual pixel;

FIG. 12 is a schematic diagram of the epitaxial PIN diode design showing the diode with unacceptable leakage;

FIG. 13 is a schematic diagram of the epitaxial PIN diode design showing an embodiment where a sidewall is no longer under bias;

DETAILED DESCRIPTION OF THE EMBODIMENTS OF THE INVENTION

Figure 3:
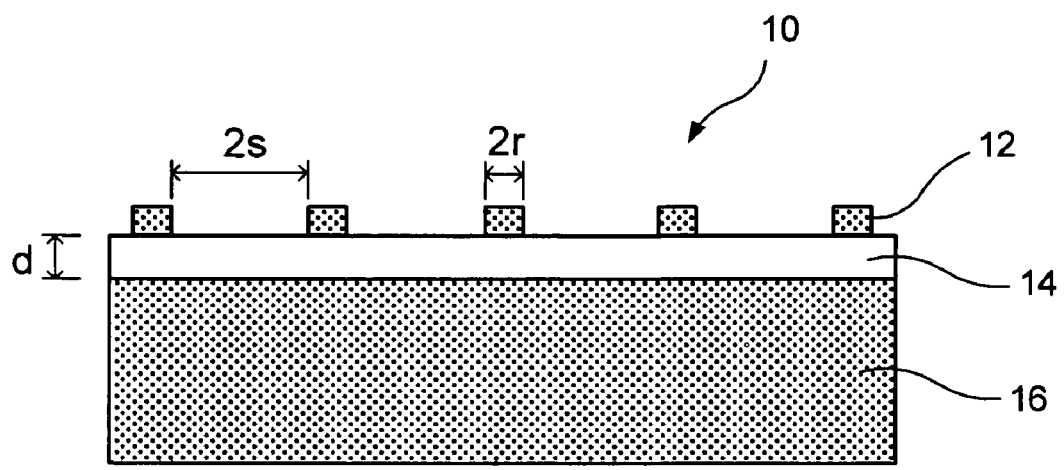
FIG. 3 is a cross-sectional view of a large area PIN diodes with small capacitance, where collector contacts are shown disposed on the depleted region.
Figure 4:
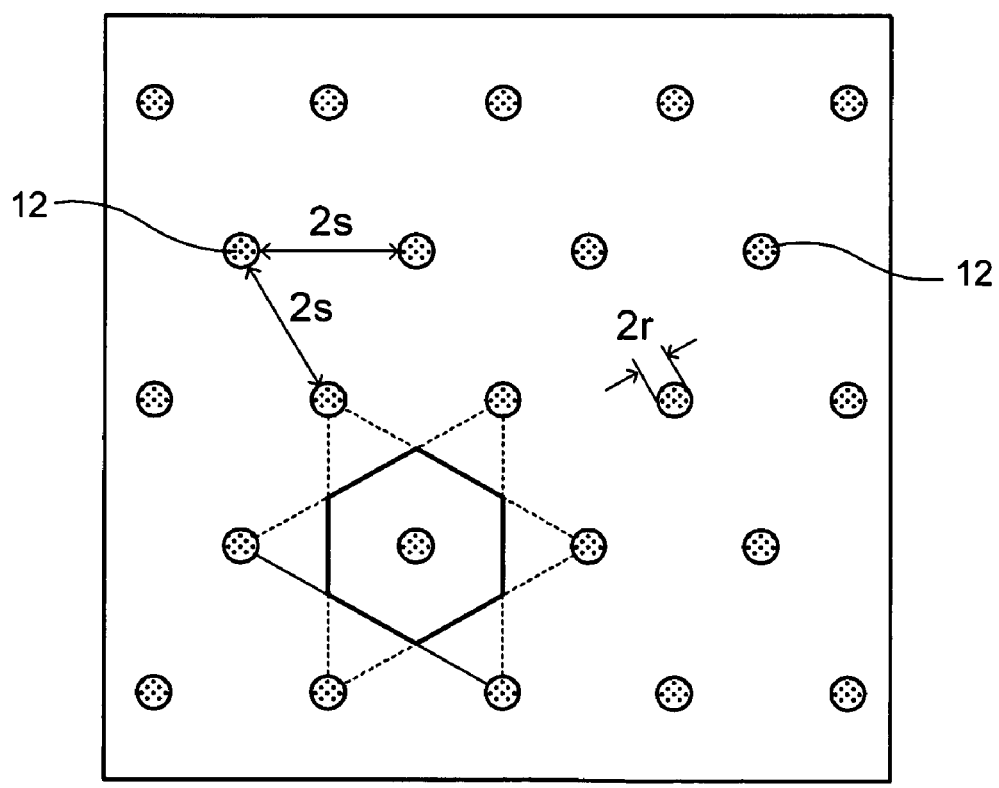
FIG. 4 is a top plan view of the large area PIN diodes with a small capacitance of FIGS. 3 showing the contacts.

Referring now to FIGS. 3 and 4, illustrating essential features of one aspect of the invention and showing a large PIN diode 10 with small capacitance. The cross-section of the PIN diode is depicted in FIG. 3, where collector contacts 12 (p-type, for example) are shown disposed on the intrinsic (depleted) region 14 disposed on the n region 16. The surface between the contacts is passivated by dielectric, such as for example, a silicon nitride layer. FIG. 4 illustrates the top view of the contacts.

The total area of the collector contacts 12 is much smaller than the area of the diode and the contacts are spaced from each other by the distance 2s. Such distance should be not too large so that the travel time of holes over the distance s is much smaller than the lifetime of holes in the intrinsic region. All contacts 12 are connected together by thin metallic lines (not shown in FIGS. 3 and 4), which are disposed over a dielectric layer covering all contacts 12 and accessing them through via holes.

In the embodiment of FIGS. 3 and 4, in a way of example, the contacts form a hexagonal lattice with the unit cell area of $2s^2\sqrt{3}$. As illustrated in FIG. 4, the area of collection by a given contact is a unit cell and has the shape of a hexagon.

The diode capacitance is a key parameter that governs the noise in the front-end amplifier circuit, which is mainly associated with the thermal and flicker noise of the input MOS transistor. The input MOS transistor dominates the noise introduced by the readout electronics due to signal amplification in the preamplifier stage. Hence its optimization provides optimal sensitivity.

As illustrated in FIGS. 3 and 4, the PIN diode according to this aspect of the invention is formed between a continuous plane of one polarity, (n-type for example), and an array of collector contacts 12 of the other polarity, (p-contacts for example). If the linear dimensions of p contacts 12 is small compared to the spacing 2s between the contacts, then the capacitance is much reduced, compared to the conventional PIN diode, where both contact layers are continuous planes. The capacitance reduction is quantitatively discussed below. Qualitatively, the capacitance is governed by the total area of the contacts 12 which can be much smaller than the area of the diode 10. The larger is the spacing 2s between the contacts, the larger will be the reduction of the capacitance. Thus, the issue of what limits the contact spacing is essential.

The limitations on the spacing of the collector contacts arise from the following considerations. Firstly, the speed of response required of the PIN diode. The travel time of minority carriers must be shorter than the allowed integration time $\tau_{int}$ for the diode. For PIN diodes employed in optical communication this would be very restrictive limitation. However, for PIN diodes employed in imaging arrays, the integration time may be longer than 10 µs, perhaps as long as 1 ms and even longer.

The other limitation arises from the requirement that the travel time of carriers to the nearest contact must be shorter than the lifetime of carriers, which in the depleted diode region is typically limited by the Shockley-Read-Hall generation/recombination processes associated with deep-level impurities. The rate of these process, $1/\tau_g$, can be estimated from the measured density of the dark current in our PIN diodes, governed by SRH generation, $$J = \frac{en_i d}{\tau_g} \quad (3)$$

It has been found I=10 pA in 1 mm×1 mm diodes, i.e., J=1 nA/cm². The intrinsic carrier concentration in our quaternary InGaAsP diodes was about $7\times10^8$ cm$^{-3}$ based on the known $n_i=1.3\times10^7$ cm$^{-3}$ of InP and the fact that the bandgap of our diodes has been designed to be 100 meV narrower than that of InP. Using Eq. (3) we find $\tau_g \approx 20$ µs.

Thus, both of the limitations will be satisfied if the travel time $\tau_{tr}$ of holes over the distance s is about 1 µs or shorter. The transport of holes to the nearest collector contact proceeds by diffusion and drift. If the distance s is very large, then the potential in the middle region between any two contacts is relatively flat and the transport is by diffusion. Since drift is faster, by assuming only diffusion an upper bound estimate for $\tau_{tr}$ or equivalently, the diffusion relation $s^2 = D\tau_{tr}$ gives a lower-bound estimate for s. Taking D=10 cm²/s and $\tau_{tr}$=1 µs, we find s≈32 µm, which is certainly an underestimate. More accurate estimate can be obtained by numerical simulation, solving the drift-diffusion equation for a given electrode geometry. Thus, the collector contacts can be safely spaced by 2s≈60 µm and perhaps by as much as twice that distance.

Referring now to FIGS. 5 and 6, illustrating comparison of the honeycomb (hexagonal) and square-lattice arrangements of the collection contacts. For same value of the longest distance b to the nearest collection point, the honeycomb lattice has 30% larger unit cell area, which advantageous from the standpoint of improved capacitance. Conversely, for the same value of capacitance, the honeycomb lattice will have 30% shorter maximum travel time $b^2/D$. The value of b is related to the nearest neighbor separation 2s by the following relations: $s=b\sqrt{2}/2$ for the square lattice and $s=b\sqrt{3}/2$ for the honeycomb.

It is instructive to compare the hexagonal lattice of collector contacts, illustrated in FIG. 5, with a square lattice arrangement of the contact array shown in FIG. 6. To do this comparison, the unit cell area $A_1$ is expressed in terms of the longest distance b within the collection area corresponding to a given contact. For the hexagonal lattice, whereas for the square lattice one has, see FIGS. 5 and 6. This means that the honeycomb (hexagonal lattice) arrangement of the contacts is advantageous.

$$A_1 = 2s^2\sqrt{3} = (3/2)b^2\sqrt{3} \; A_1 4s^2 = 2b^2$$

Referring now to FIG. 7, illustrating parallel plate capacitor 20 formed by a circular disc 22 having radius r separated by distance d from an infinite plane electrode 24. A reasonably accurate expression for the capacitance of the disk-plane electrode system is given by Eq. (6). An equivalent formulation of the same capacitance problem is in terms of a two-disc electrode system—but separated by distance 2d. The equivalence follows from the image-charge theorem of electrostatics.

Quantitative analysis of the capacitance requires an accurate account of the fringing fields. Capacitance between a circular disc 22 of radius r and an infinite plane electrode 24 that is distance d apart, (see FIG. 7), is a well known prior art problem that dates back to Kirchhoff (1877). It is known that the capacitance of a circular disk 22 of radius r, separated by the distance d from an infinite planar electrode 24, is given by $$\frac{C(d)}{C_0(d)} = 1 + \frac{2d}{\pi r}\ln\frac{8\pi r}{ed} + \left(\frac{d}{\pi r}\ln\frac{8\pi r}{d}\right)^2 \quad (4)$$

where $C_0$ is the elementary capacitance, calculated neglecting the fringing fields, $$C_0(d) = \frac{\varepsilon_0 \varepsilon \pi r^2}{d} \quad (5)$$

Here $\varepsilon$ is the relative permittivity and $\varepsilon_0$ the vacuum permittivity. To avoid misunderstanding, the "e" in the denominator under logarithm in Eq. (4) is the Euler number, so that $\ln(8\pi r/ed) \equiv \ln(8\pi r/d) - 1$.

Eq. (4) and similar formulae were previously compared with the results of exact numerical calculations. They found that for $r/d > 2$, equation (4) estimates the capacitance with virtually no error and even for $r/d \approx 1$ the error is less than 2%. This should be contrasted with the original Kirchhoff formula that corresponds to the first two terms in Eq. (4) and gives over 16% error already at $r/d \approx 2$. The exact numerical calculations lie very accurately on a straight line, in the entire range $0 < d/r < 2$ that is of interest to us in the present invention. This empirical linear approximation is extremely convenient to use and its justification can perhaps be found by an analysis similar to that due to Rao[1] and valid in the large-gap limit, $d > r$. The accurate linear interpolation formula can be written in the form:

$$\frac{C(d)}{C_0(d)} = 1 + \frac{8}{\pi}\left(\frac{d}{r}\right) \quad (6)$$

which can be viewed as simply a sum of the elementary capacitance $C_0(d) = \varepsilon_0 \varepsilon \pi r^2/d$ and the proper capacitance of a disk, $C(r) = \varepsilon_0 \varepsilon 8r$. For $d/r = 1$ equation (4) yields $C(d) = 3.469 C_0(d)$ and Eq. (6) similarly gives $C(d) = 3.5 C_0(d)$. Obviously, the fringing field effect should not be neglected.

It should be noted that equations (4) and (6) apply to the case when the entire half-space above the ground plane is filled with a uniform dielectric. If the space above the disc 22 has a lower permittivity than that below the disk (assuming that the dielectric layer is infinitely extended laterally below the disk), then the fringing-field effects will be somewhat reduced. The effect can be taken into account quite accurately, (see FIG. 8).

Referring now to FIG. 8 which illustrates a parallel plate capacitor 25 formed by a circular disc 26 of radius r separated by distance d from an infinite plane with a dielectric layer 28 of relative permittivity $\varepsilon$ inserted between the plane and the disk as shown. The space above the dotted line is assumed to have $\varepsilon = 1$. This description equally applies to the case of two dielectrics (not shown)—one above, the other below the dotted line—in which case one takes for $\varepsilon$ the ratio of their permittivities.

This case has been considered by Chew and Kong,[2] who obtained the following result:

$$\frac{C(d)}{C_0(d)} = 1 + \frac{2d}{\pi r \varepsilon}\left(\ln\frac{8r}{d} + A - 2\right) + \left(\frac{d}{\pi r \varepsilon}\right)^2 \left(\ln\frac{8r}{d} + A - 1\right)^2 \quad (7)$$

here $\varepsilon$ is the relative permittivity and $$A = 1 - 2\varepsilon \sum_{n=1}^{\infty} \left(\frac{1-\varepsilon}{1+\varepsilon}\right)^2 \ln n + \varepsilon \ln \pi + (\varepsilon - 1)\ln 2 \quad (8)$$

For $\varepsilon \to 1$ one has $A \to 1 + \ln \pi$ and we recover Eq. (4). For $\varepsilon \neq 1$, there is a linear interpolation formula, similar in spirit to Eq. (6) and due to Wheeler,[3] which gives an excellent approximation to Eq. (7):

$$\frac{C(d)}{C_0(d)} = 1 + \frac{4}{\pi}\frac{\varepsilon + 1}{\varepsilon}\left(\frac{d}{r}\right) \quad (9)$$

For $d/r \approx 1$ and $\varepsilon \approx 2$ the correction is rather small, but the fringe contribution to the capacitance is indeed reduced. In the case of interest, the dielectric between the plates is InGaAsP ($\varepsilon \approx 12.8$) and the space above the disc is $Si_3N_4$ ($\varepsilon \approx 7.5$). In this case, the relative $\varepsilon_{rel} \approx 1.71$ and we find from (7) and (8) that $C(d) = 3.0 C_0(d)$ for $d/r \approx 1$. Thus, tangible reduction has been obtained compared to the uniform case, where for $d/r \approx 1$ we had $C(d) = 3.5 C_0(d)$.

Referring now to FIGS. 9 and 10 illustrating a schematic diagram of electrical connections in a single pixel. The depicted structure comprises substantially of a common cathode 36, a depleted region of the PIN diode 34 and a passivating dielectric 38 ($Si_3N_4$, for example) with a plurality of collector contacts 32. An interlevel dielectric 42 is disposed above the dielectric 38 and can be made of $SiO_2$. The collector contacts 32 in a given pixel are connected together by thin metallic lines or runners 44 disposed over the interlevel dielectric layer 42. The connection between the runners 44 and the collector contacts 32 is carried out by means of contact metallic member 45 accommodated in the via holes 46 formed in the dielectric 42.

The capacitance introduced by the metal runners 44 is a function of the runner width a, the thickness $d_{ox}$ and relative permittivity $\varepsilon_{ox}$ of the interlevel dielectric 42 and the connection geometry. Minimizing the total length of the metal runners for a given collector contact array will not bring substantial results. However, it is worth noting that for the square lattice, the length of the runners 44 will be shorter than for the honeycomb structures. This is especially so, if the spacing s is kept constant. It has already been noted in connection with FIGS. 5 and 6, that it makes more sense to compare the two lattice arrangements keeping constant the longest distance b within the collection area corresponding to a given contact. Since $s = b\sqrt{2}/2$ for the square lattice and $s = b\sqrt{3}/2$ for the honeycomb, we can write the total length of the runner for a pixel of total area A as follows:

$$L_{sq} = \frac{A}{2s} = \frac{A}{b\sqrt{2}}, \quad L_{hex} = \frac{A}{s\sqrt{3}} = \frac{2A}{3b}. \quad (10)$$

It follows from Eq. (10) that for the same value of b, the hexagonal lattice is again preferable from the consideration of the shortest runner length. Previously, in connection with FIGS. 5 and 6 this approach was found to be preferable from the standpoint of having the largest unit cell area for a given b. We recall that b is ultimately limited by the requirement that the travel time of carriers to the nearest contact be shorter than the lifetime of carriers and the chosen integration time.

The reason or a potential reduction of the runner length is primarily to minimize the parasitic capacitance due to the runner. In analogy with Eqs. (6) and (9), the parasitic capacitance can again be estimated as a sum of two contributions, an elementary parallel-plate capacitor of area aL, where a is the width of the runner, and the proper capacitance of the long wire. The former contribution is taken neglecting the fringing field, and is of the form.

$$C_R^{(pp)}(L) = \frac{\varepsilon_0 \varepsilon_{ox} aL}{d_{eff}}, \text{ where } d_{eff} = d_{ox} + (\varepsilon_{ox}/\varepsilon)d. \quad (11a)$$

The wire capacitance is approximately given by $$C_R^{(w)}(L) = \frac{\varepsilon_0(1+\varepsilon_{ox})\pi L}{\ln 2L/a}. \quad (11b)$$

Figure 1:
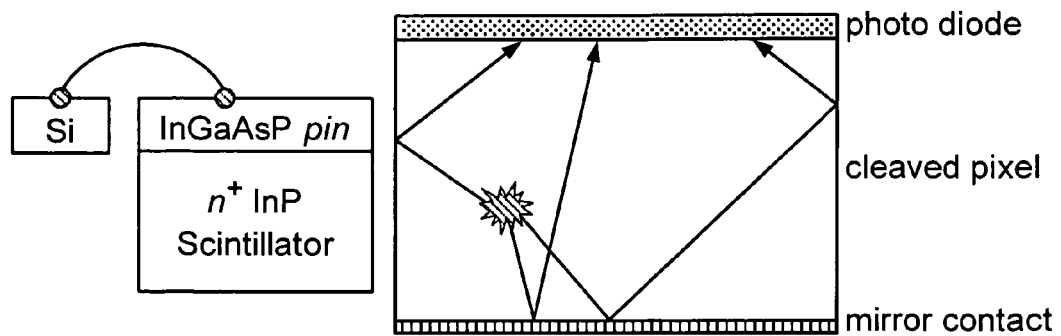
FIG. 1 is a schematic diagram of a prior art cleavered-pixel design diode.
Figure 2:
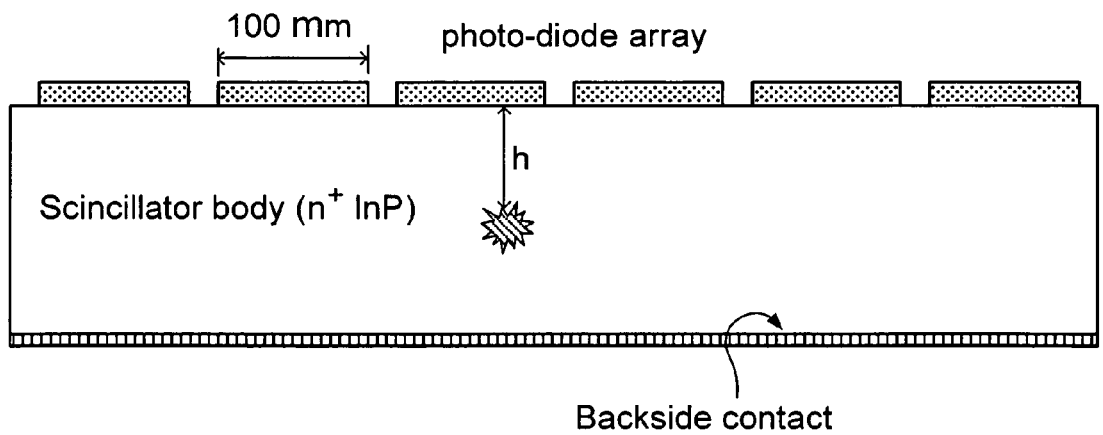
FIG. 2 is a schematic diagram illustrating a prior art integrated pixel architecture showing diodes forming an array of squares or hexagons.

The estimate of capacitance reduction is now presented in the instance of a preferred embodiment of the present invention, namely the design of a pixel for the epitaxial photoreceiver disposed on the surface of a semiconductor scintillator. This could be useful for either the cleaved-pixel or integrated-pixel designs, discussed in connection with the prior art arrangements illustrated in FIGS. 1 and 2.

For concreteness, estimates will be made for a pixel of area 1 mm×1 mm. If the p contact formed a continuous plate, the capacitance of such a diode, $C_{Cont\,Plate}$, implemented in InP with the depleted region d≈2 μm, would be about 50 pF. Instead we have the p contact in the form of an array of small discs of diameter 2r separated by the distance 2s.

The scintillator material is InP and the epitaxial photoreceiver is InGaAsP alloy of bandgap about 100 meV smaller than that of InP, so that the interband emission of InP is fully absorbed in the PIN diode. To estimate the capacitance we need to know the permittivity of the quaternary $In_{1-x}Ga_x As_y P_{1-y}$ alloy lattice-matched to InP. The lattice-matched condition is important because otherwise dislocations will have a detrimental effect on the photoreceiver performance. For lattice-matched compositions (x=0.454y) the alloy bandgap can be determined[4] by an interpolation according to Vegard's law $E_G(y)=1.35-0.72y+0.12y^2$, and the desired bandgap value $E_G^{Ph}=1.24$ eV is achieved with x=0.07 and y=0.16. The permittivity of the quaternary alloy can be determined by a similar Vegard's interpolation, $$\varepsilon(x,y)=(1-x)y\varepsilon_{InAs}+(1-x)(1-y)\varepsilon_{InP}+xy\varepsilon_{GaAs}+x(1-y)\varepsilon_{GaP}. \quad (12)$$

using the literature values of the relative permittivity of binary semiconductors, $\varepsilon_{InAs}=15.15$, $\varepsilon_{InP}=12.5$, $\varepsilon_{GaAs}=12.9$, and $\varepsilon_{GaP}=11.1$, we find that for the quaternary alloy of interest the relative permittivity is $\varepsilon_{InGaAsP}=12.82$. We assume that the space above the discs is filled with silicon nitride, $\varepsilon_{Si_3N_4}=7.5$, so that the ratio of permittivities that enters Eq. (9) is $\varepsilon=1.71$.

Consider, exemplarily, r=2 μm≈d and s=30 μm with honeycomb arrangement of the disc array. The reduced capacitance of the disc array is given by Eq. (9) times the ratio of disc area to the unit cell area, $$\rho_1 = \frac{C_{Disc\,Array}}{C_{Cont\,Plate}} = \frac{\pi r^2}{2s^2\sqrt{3}}\left[1+\frac{4}{\pi}\frac{\varepsilon+1}{\varepsilon}\left(\frac{d}{r}\right)\right] \approx 2 \times 10^{-2} \quad (13)$$

The parasitic capacitance, due to the metallic runner of width a=2 μm over an interlevel dielectric (assumed SiO$_2$, relative permittivity $\varepsilon_{ox}$=3.9) of not too large thickness $d_{ox}$≈2 μm, will be estimated using Eq. (11a) and Eq. (10) for hexagonal lattice. This yields $$\rho_2 = \frac{C_R}{C_{Cont\,Plate}} = \frac{2a}{s\sqrt{3}}\frac{1}{1+(\varepsilon d_{ox}/\varepsilon_{ox}d)} \approx 2 \times 10^{-2} \quad (14)$$

It has been observed that both contributions are similar in magnitude and combined indicate a reduction by a factor of 25 over the continuous plate pixel. This is a conservative estimate based on the disc spacing limited by diffusion only. Taking into account drift will increase the possible spacing to at least a factor of 2. Therefore, it is expected that the technique will allow the fabrication of PIN diode pixel of 1 mm$^2$ area with C≈1 pF, which is a 50-fold reduced capacitance, compared to that of a continuous 1 mm$^2$ plate.

Referring now to FIG. 11, illustrating a block diagram of the readout ASIC design for an individual pixel. The integration time is controlled by the pulse-shaper time constant τ

The traditional design of readout circuits is based on the assumption that the dominant noise sources are the shot noise of the detector and noise (thermal and flicker noise) of the input MOS transistor. The input MOS transistor dominates the noise introduced by the readout electronics due to signal amplification in the preamplifier stage. Hence its optimization provides optimal sensitivity.

For the optimal pulse shaping with the shaper time constant τ, the calculated equivalent noise charge (ENC) is given by $$ENC^2 = (C_{DET}+C_{MOS})^2\left[\frac{a_{th}}{\tau}\cdot\frac{8kT}{3g_m}+\frac{a_f K_f}{C_{MOS}\cdot f}\right]+a_{sh}\tau 2qI_{LK} \quad (15)$$

where $C_{DET}$ and $C_{MOS}$ are the capacitances of the photodetector and the MOS transistor, respectively, $I_{LK}$ is the leakage current and $g_m$ is the transistor transconductance. Here, $a_{th}$, $a_{sh}$ and $a_f$ are dimensionless integration constants (of order unity) and $K_f$ is the 1/f noise coefficient. The ENC quantifies sensitivity of the electrical readout circuitry in terms of the charge at the output of the detector that would produce a voltage signal at the output of the readout electronics equal to the noise contribution of both the detector and electronics.

Equation (15) shows the importance of the photodetector diode area in the noise budget. The shot noise contribution directly scales with the leakage current and the input MOS transistor noise directly scales with the detector capacitance. The design parameter is the shaper time constant, τ, which inversely scales the thermal noise contribution of the input transistor and directly scales the shot noise contribution of the detector. The shorter τ reduces the shot noise but exacts a penalty from thermal noise for increasing bandwidth.

In the traditional design, both the leakage current and the detector capacitance are expected to scale directly with the area. Smaller area would reduce both terms in the equivalent noise charge and this has been the main motivation of the present invention in pursuing the integrated prior art pixel design. The integrated-pixel detector design with 100-fold smaller pixel area leads to a dramatically lower limit of the detectable charge per pixel. However, the useful signal is also expected to be reduced (albeit by a smaller amount) because the scintillation photons, generated by a single gamma interaction a distance h away from the surface of detectors, will be shared by a number pixels within the area of about h$^2$, as discussed in connection with Eqs. (1) and (2). Still another trade-off, involved in the integrated-pixel design, is rooted in the fact that each pixel must contain the electrical readout circuitry. With the decreasing detector size, the area becomes an important design parameter that has to be included into optimization of the input transistor.

In contrast, in the low-capacitance disk-array pixel, the reduction of capacitance occurs independently of dark current. One must therefore revise the approach to noise analysis, by taking the dark current as constant, while scaling the diode capacitance. The analysis must be carried in two steps. First, one must optimize the integration time (i.e., the shaper time constant, τ). As the capacitance is reduced, the shot noise form the PIN diode dark current stays the same, because the diode collection volume remains constant, while the amplifier noise, both thermal and flicker, are reduced with the diode capacitance. Therefore, the smaller the capacitance the shorter should be the integration time. Second, one evaluates the ENC for the optimum τ.

Such an analysis was carried out[5] for an exemplary PIN diode of 1 mm$^2$ pixel area. For the continuous plate pixel architecture, such a diode has a capacitance of approximately C=50 pF and the leakage current of $I_{LK}$=10 pA at 1V reverse bias. Varying the capacitance C downward while keeping $I_{LK}$ constant, it was found that the optimum integration time scales down from about 22 μs at C=50 pF to about 2 μs at C=2 pF.

The value of 2 pF corresponds to the conservative estimates of Eqs. (13) and (14). The ENC is thereby reduced from about 250 electrons at 50 pF to about 50 electrons at 2 pF. Lowering the detectable charge to as low as 50 electrons in a 1 mm$^2$ pixel is a dramatic improvement of the photo-detection system for the semiconductor scintillator.

The exceptional sensitivity resulting from the capacitance reduction—with no reduction in the collection volume—should be useful for a variety of imaging systems that must be sensitive to low levels of radiation.

It has been discussed hereinabove that the present invention provides a semiconductor photodiode having an active region which consists substantially of the first epitaxial semiconductor region 66, the base second epitaxial semiconductor region 64, and the third semiconductor region 78. The first semiconductor region is also provided with an arrangement or means for providing electrical contact thereto. The first semiconductor region 66 can be in the form of an emitter layer having a first type of conductivity. The second or base epitaxial semiconductor region 64 comprises a semiconductor layer which is in contact with the emitter layer 66. As to the third semiconductor region 78, it is arranged so as to be in contact with the base region 64 and comprises a plurality of separated collector regions 62 of a second conductivity type. The photodiode also includes a low capacitance conducting arrangement or means 76 for providing electrical contacts to all collector regions 62. The collector regions 62 are spaced apart from each other in the lateral direction of the semiconductor diode by the distance which is substantially greater than the width of the respective regions. It should be noted however, such distance is substantially short, so that travel time by the carriers of the second conductivity type from the farthest point between the collection regions to the nearest collection region being shorter than the life time of the carriers in the base region 66. The conducting arrangement 78/76 has capacitance which is lower than the combined capacitance of all collector regions 62. The emitter layer 66 of the first conductivity type is n-type conductivity layer, whereas the separated collector regions 62 of the second conductivity type are associated with respective holes. In one embodiment of the invention the collector regions 62 is an array which can be in the form of a honeycomb lattice. The collector regions 62 can be also formed having configuration of substantially circular disks.

The lower-capacitance conducting arrangement for providing electrical contacts to the collector regions 62 comprises a plurality of metallic runners 76 which are separated in the longitudinal direction of the semiconductor diode from the third semiconductor region 78 by an interlevel dielectric layer 72. In one embodiment of the invention the width of the runners 76 is less than the diameter of the respective collector regions 62. The lower-capacitance arrangement for providing electrical contacts to all collector regions further comprises via holes 75 in the interlevel dielectric layer 72. The via holes 75 are adapted to accommodate metal blogs 77 provided to link the collector regions 62 with the metallic runners 76,78.

The epitaxial PIN diode designs are shown in FIGS. 12 and 13. FIG. 12 depicts a diode with unacceptable leakage, due to a parasitic current path on the cleaved crystal sidewall (as indicated by the arrow A). FIG. 13 illustrates an improved design, where the sidewall is no longer under bias. The epitaxially grown diode structure is nin rather than pin with the p$^+$ region has been subsequently introduced by Zn diffusion.

Referring now to FIGS. 14-19 illustrating the method of fabrication of the epitaxial disk-array pixels. That technology has been developed to minimize the surface leakage at cleaved surfaces of the pixel, in the cleaved-pixel design illustrated in FIGS. 12 and 13.

Surface leakage is a known problem and it had been encountered and resolved in the prior art in the implementation of InGaAs avalanche photodiodes (APD) for optical telecommunications. In such devices the low dark current requirement is essential, similar to that of the invention. Initially, a preferred approach has been to avoid placing the cleaved surface under voltage. According to the present invention, to circumvent the problem of surface leakage, the pixel design has been changed, so that the surface is no longer under bias. The diodes produced in this way have a good performance from the standpoint of dark current. The reverse-bias leakage current, interpreted in terms of Eq. (3), corresponds to the carrier lifetime of 20 μs. Interpreted in terms of the Shockley-Read-Hall process, this implies a very low concentration $N_T$<10$^{13}$ cm$^{-3}$ of deep-level traps in the depletion region of the diode. These fabrication principles will be described in the preferred embodiment of the method of the invention for manufacturing of the disk-array pixel, presented below.

The preferred fabrication sequence for manufacturing of the disk-array pixel in accordance with the method of the present invention is schematically illustrated in FIGS. 14-19. The fabrication is based on Zn deposition and diffusion in the OMCVD reactor. The method of fabrication begins with the step of epitaxial growth of n$^+$in layers comprising a thin first epitaxial semiconductor (exemplarily, 0.2 μm) n$^+$ layer 66 overlaid by an undoped ("intirinsic") i base or a second epitaxial region 64 having thickness of about 2 μm and a thin (exemplarily, 0.2 μm) and low-doped (exemplarily, 10$^{17}$ cm$^{-3}$) top or third semiconductor n layer 78. The p$^+$ doping is introduced subsequently by a selective diffusion of Zn. Selective diffusion is accomplished by covering a surface of the top or third semiconductor layer 78 with a first dielectric layer 68. In one of the embodiments this dielectric can be, for example Si$_3$N$_4$ having the thickness of 0.2 μm. The layer 68 is patterned, so that holes 65 are opened for diffusion. In this manner, p$^+$ regions 62 are produced underneath the holes 65. Although the holes 65 of any conventional configuration are contemplated, in the preferred embodiment, such holes 65 are substantially circular.

Figure 14:
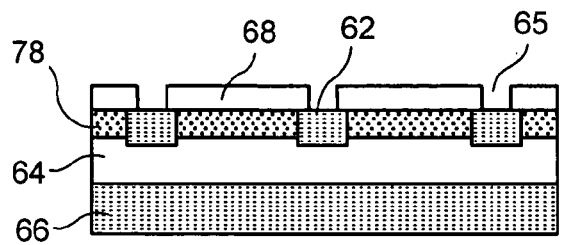
FIG. 14 is a schematic diagram of a first step of the fabrication sequence of the method of the invention, where epitaxial layers are covered with a first dielectric layer.

The cross-section view of the structure after the diffusion step is illustrated in FIG. 14 showing that an active region including epitaxial layers n$^+$ i n (respectively, 66,64,78) are covered with the first dielectric layer 68. A silicon nitride can be used as a material of this dielectric layer. In order to form holes 65 for Zn diffusion, the layer 68 is then patterned with a mask M1. The diffused Zn regions 62 represent the p$^+$ contacts.

Figure 15:
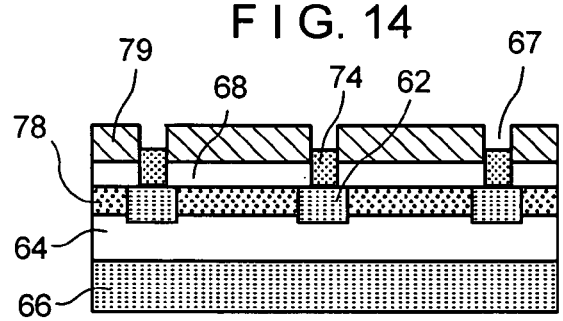
FIG. 15 illustrates the next step of the fabrication sequence, where a second dielectric layer is provided, and metal contacts regions are disposed.

Referring now to FIG. 15 illustrating the next step of the method of the invention which is provided for deposition of p-metal contacts 74. FIG. 15 actually shows the cross-sectional view of the structure after the metal deposition step. In this method step a second dielectric or silicon nitride layer 79 is deposited on the first dielectric layer 68 and patterned with a mask M2 which is similar to the mask M1. However, concentric openings of the M2 mask have smaller diameter. The metal contacts 74 associated with the p$^+$ regions 62 can be deposited utilizing a variety of technological approaches.

Nevertheless the use lift-off technique is preferred for this operation. To do this, the structure is covered with the second dielectric layer 79, made of $Si_3N_4$ for example. The layer 79 is then patterned with the mask M2 in such a manner that holes 67 are produced concentric with the holes 65 of the M1 mask, but having smaller diameter. In the lift-off technique, p-metal is deposited while the resist is still on and then removed everywhere except in the above-mentioned holes 67. The same mask M1 can be used in this operation. However, it is preferable to use a different mask M2 having slightly smaller diameter features. This is because metal contacts 74 should only cover the p$^+$ diffused regions 62 and the smaller-diameter features of the M2 mask mitigate the possible misalignment of the metal contacts.

Figure 16:
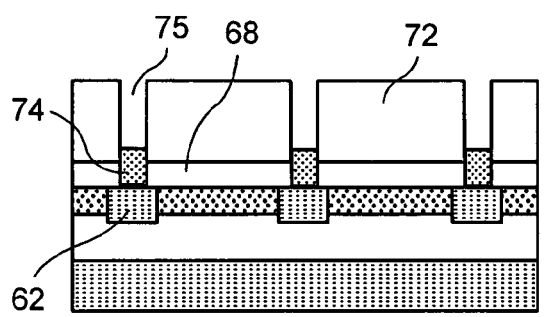
FIG. 16 illustrates a further step of the fabrication sequence.

The next step of the method of the invention is illustrated in FIG. 16. In this step an interlevel dielectric layer 72 is deposited, so as to form the respective openings 75 corresponding to the metal contacts 74. This step is carried out using either Mask M2 or another mask M3, which is similar to M2 but having smaller-diameter openings. It is possible to use the M3 mask rather than M2, so as to expose only the top surface of metal contacts 74 and not that of $Si_3N_4$ layer. In a way of example, the interlevel dielectric 72 can be 2 µm thick and made of $SiO_2$. In the process of deposition of the dielectric layer 72, it is preferable to use the dielectric having a good etch selectivity relative to the passivating dielectric used for the layer 68. This should mitigate against possible misalignment of the mask M3 against the mask M2. An essential feature of this step is that the sidewalls of the openings 75 should not be excessively steep, so that the final metal runners 77,76 deposited in the next step of the method does not break its wall continuity.

Figure 17:
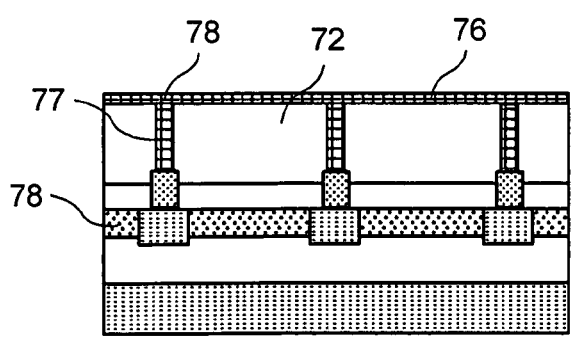
FIG. 17 illustrates still another step of the fabrication sequence, where metal runners are disposed and patterned using a mask and all contacts are connected together.
Figure 18:
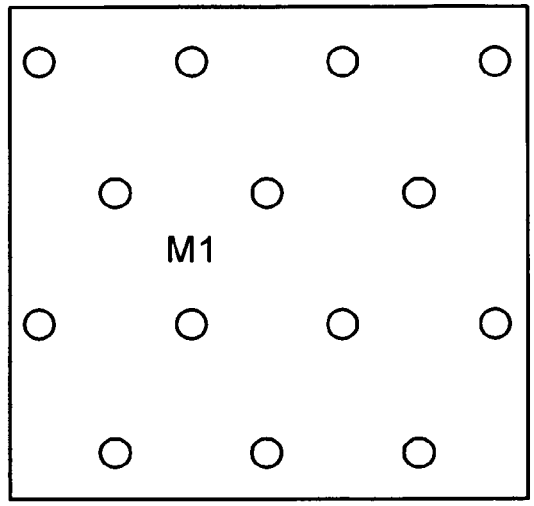
FIG. 18 is a view of one of the masks used in the method of the invention.
Figure 19:
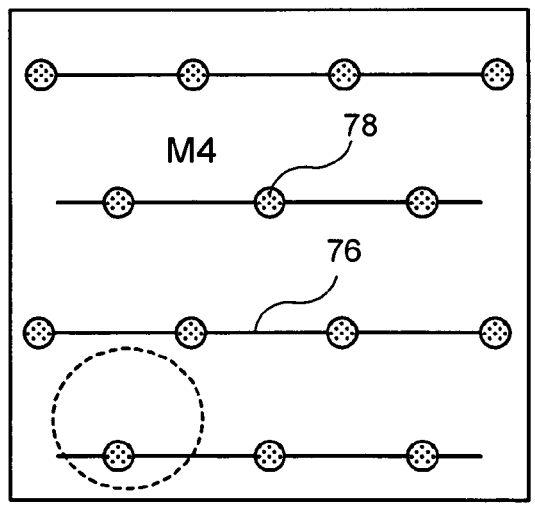
FIG. 19 illustrates a final step of the method.

A further step of the method, illustrated in FIG. 17, involves deposition of the final metal runners 76 using a mask M4. The metal runners 76 are relatively thin, 2 µm in width for example. From the capacitance standpoint the thinner is the runner 76 the better. However, continuity of the long runner is an essential factor. This continuity is particularly challenging at the sidewalls of the openings 75. To ensure the contact, the thin runner 76 widens up to form disks 78, that are concentric and overlapping the circular features in the mask M3. According to FIG. 17, metal runners 76 are deposited and patterned using the mask M4 (see FIG. 19). The metal runner widens up over each contact, forming disks 78 of larger diameter and overlapping the features in the masks M1-M3. Sidewalls of the openings 75 must not be too steep, so that the metal runners 76 retain their continuity. Dashed circles on mask M4, as illustrated in FIG. 19, indicate the contact pad for connecting the pixel to readout circuitry. In this step, all contacts are connected together.

Finally, by bonding or using solder or indium bumps, a contact pad for contacting the pixel is being provided. The metal pad is schematically shown by a dashed circle on the mask M4 (see FIG. 19). It can be implemented as a feature of the M4 mask, or using another interlevel dielectric, not shown in the drawing. The radius of the circular pad can be about 25 µm. The contact pad will introduce a negligible additional capacitance to the 1 mm$^2$ pixel, since its area is less than 0.2% of the pixel area.

The invention claimed is:

1. An article including a semiconductor photodiode having an active region comprising:
    a first epitaxial semiconductor region comprising an emitter layer of first conductivity;
    a base second epitaxial semiconductor region, said second semiconductor region being essentially undoped and having a contact with the emitter layer;
    a third semiconductor region being in contact with the second region and comprising a plurality of spaced from each other collector regions of second conductivity, said collector regions are spaced apart from each other by a distance which is substantially greater than a size of the third semiconductor region, a travel time between the collector regions of the second conductivity is shorter than the lifetime of carriers in the base region;
    a contact arrangement providing electrical contacts to the collector regions, said contact arrangement having capacitance being lower than a combined capacitance of the collector regions; and
    an arrangement providing electrical contact to the first semiconductor region.

2. The article of claim 1, wherein the first conductivity type is n-type, the carriers of second conductivity type are holes and said collector regions form a regular array.

3. The article of claim 2, wherein said regular array is a honeycomb lattice.

4. The article of claim 1, wherein said collector regions are formed having configuration of substantially circular disks having diameter less than 5 microns.

5. The article of claim 1, wherein said collector regions are spaced apart by a distance greater than 50 microns.

6. The article of claim 1, wherein said second epitaxial base region is a direct-gap semiconductor.

7. The article of claim 6, wherein said second epitaxial base region is InGaAsP alloy lattice-matched to InP.

8. The article of claim 6, wherein said second epitaxial base region is InGaAs-N dilute-nitride alloy lattice-matched to GaAs.

9. The article of claim 1, wherein a spacing area between said collector regions is covered by a passivating dielectric.

10. The article of claim 1, wherein said low-capacitance contact arrangement for contacting the collector regions comprises a plurality of metallic runners having width which is less than the diameter of said regions, said metallic runners being separated in the longitudinal direction of the photodiode from the third semiconductor region by an interlevel dielectric layer.

11. The article of claim 10, wherein said low-capacitance contact arrangement for contacting the collector regions further comprise via holes in said interlevel dielectric layer, said via holes are aligned with the respective collector regions.

12. The article of claim 11, wherein each said via holes contains metal plugs for linking each said collector region with the metallic runners.

13. The article of claim 1, wherein said semiconductor photodiode is disposed on the surface of a semiconductor scintillator.

14. The article of claim 1, wherein said semiconductor photodiodes form an array of pixels.

15. The article of claim 14, wherein said array of pixels is integrated with readout circuitry to form an imaging system sensitive to low levels of light.

16. An article including a semiconductor photodiode having an active region comprising:
- a first epitaxial semiconductor region comprising an emitter layer of first conductivity;
- a base second epitaxial semiconductor region, said second semiconductor region being essentially undoped and having a contact with the emitter layer;
- a third semiconductor region being in contact with the second region and comprising a plurality of spaced from each other collector regions of second conductivity; said collector regions are spaced apart from each other by a distance which is substantially greater than a size of the third semiconductor region and being substantially short so that a travel time between the collector regions of the second conductivity from a furthest point between said collection regions to a nearest collection region is shorter than life time of carriers in the base region;
- a contact arrangement providing electrical contacts to the collector regions, said contact arrangement having capacitance being lower than a combined capacitance of the collector regions; and
- an arrangement providing electrical contact to the first semiconductor region.

* * * * *